US010726881B1

United States Patent
Stoerk (10) Patent No.: US 10,726,881 B1
(45) Date of Patent: Jul. 28, 2020

(54) SUPPLY VOLTAGE CLAMPING FOR IMPROVED POWER SUPPLY REJECTION RATIO

(71) Applicant: TEXAS INSTRUMENTS INCORPORATED, Dallas, TX (US)

(72) Inventor: Carsten Ingo Stoerk, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/589,291

(22) Filed: Oct. 1, 2019

Related U.S. Application Data (60) Provisional application No. 62/830,855, filed on Apr. 8, 2019.

(51) Int. Cl.
| | | |
|---|---|---|
| *H02M 1/08* | (2006.01) | |
| *H02M 3/158* | (2006.01) | |
| *H02M 3/335* | (2006.01) | |
| *G11C 5/14* | (2006.01) | |
| *G11C 8/08* | (2006.01) | |
| *G05F 1/575* | (2006.01) | |
| *G11C 11/4093* | (2006.01) | |

(Continued)

(52) U.S. Cl.
CPC .............. *G11C 5/147* (2013.01); *G05F 1/575* (2013.01); *G11C 8/08* (2013.01); *G11C 11/4074* (2013.01); *G11C 11/4093* (2013.01); *G11C 11/4099* (2013.01)

(58) Field of Classification Search
CPC ....... G11C 5/147; G11C 11/4074; G11C 8/08; G11C 11/4093; G11C 11/4099; G05F 1/575

See application file for complete search history.

(56) References Cited

U.S. PATENT DOCUMENTS

| | | | | |
|---|---|---|---|---|
| 6,351,180 B1 * | 2/2002 | Sher | ....................... | G11C 5/145 327/525 |
| 7,141,955 B1 * | 11/2006 | Martinez | ............ | H03K 17/0822 323/272 |

(Continued)

OTHER PUBLICATIONS

Texas Instruments. "TPS65632 Triple-Output AMOLED Display Power Supply." Data Sheet. SLVSCY2A—Mar. 2015—Revised Jan. 2016. pp. 1-28.

*Primary Examiner* — Kenneth B Wells
(74) *Attorney, Agent, or Firm* — Michael A. Davis, Jr.; Charles A. Brill; Frank D. Cimino (57) ABSTRACT

A circuit includes a digital-to-analog converter (DAC) having a DAC input and a DAC output. The circuit includes a reference voltage (VREF) generator having a VREF generator input, a VREF generator output, and a VREF power supply input. The VREF generator output is coupled to the DAC input. A voltage regulator has a voltage regulator input and a voltage regulator output. The voltage regulator output is coupled to the DAC. A clamp circuit has a first clamp circuit input, a second clamp circuit input, and a clamp circuit output. The first clamp circuit input is coupled to the voltage regulator input, and the clamp circuit output is coupled to the VREF power supply input. The second clamp circuit input is coupled to the voltage regulator output. The clamp circuit includes a source-follower circuit having the second clamp circuit input.

20 Claims, 4 Drawing Sheets

(51) Int. Cl.
*G11C 11/4099* (2006.01)
*G11C 11/4074* (2006.01)

(56) References Cited

U.S. PATENT DOCUMENTS

| | | | |
|---|---|---|---|
| 7,170,269 B1 * | 1/2007 | Doyle | G05F 1/575 |
| | | | 323/280 |
| 10,164,538 B1 * | 12/2018 | Tang | H02M 3/285 |
| 10,175,706 B2 * | 1/2019 | Golara | G05F 1/573 |
| 10,468,989 B2 * | 11/2019 | Takada | H02M 3/1588 |

* cited by examiner

SUPPLY VOLTAGE CLAMPING FOR IMPROVED POWER SUPPLY REJECTION RATIO

CROSS-REFERENCE TO RELATED APPLICATION

This application claims priority to, and incorporates by reference, U.S. Provisional Application No. 62/830,855 filed Apr. 8, 2019.

BACKGROUND

Power supplies are used for numerous applications. The power supply rejection ratio (PSRR) refers to the sensitivity of the power supply's output voltage to transients in the power supply's input voltage. The output voltage from a power supply with a higher PSRR experiences a smaller amplitude change for a given input voltage transient than a power supply with a lower PSRR. Some applications benefit from a power supply with a higher PSRR.

SUMMARY

In one example, a circuit includes a digital-to-analog converter (DAC) having a DAC input and a DAC output. The circuit includes a reference voltage (VREF) generator having a VREF generator input, a VREF generator output, and a VREF power supply input. The VREF generator output is coupled to the DAC input. A voltage regulator has a voltage regulator input and a voltage regulator output. The voltage regulator output is coupled to the DAC. A clamp circuit has a first clamp circuit input, a second clamp circuit input, and a clamp circuit output. The first clamp circuit input is coupled to the voltage regulator input, and the clamp circuit output is coupled to the VREF power supply input. The second clamp circuit input is coupled to the voltage regulator output. The clamp circuit includes a source-follower circuit having the second clamp circuit input.

BRIEF DESCRIPTION OF THE DRAWINGS

For a detailed description of various examples, reference will now be made to the accompanying drawings in which.

DETAILED DESCRIPTION

Figure 1:
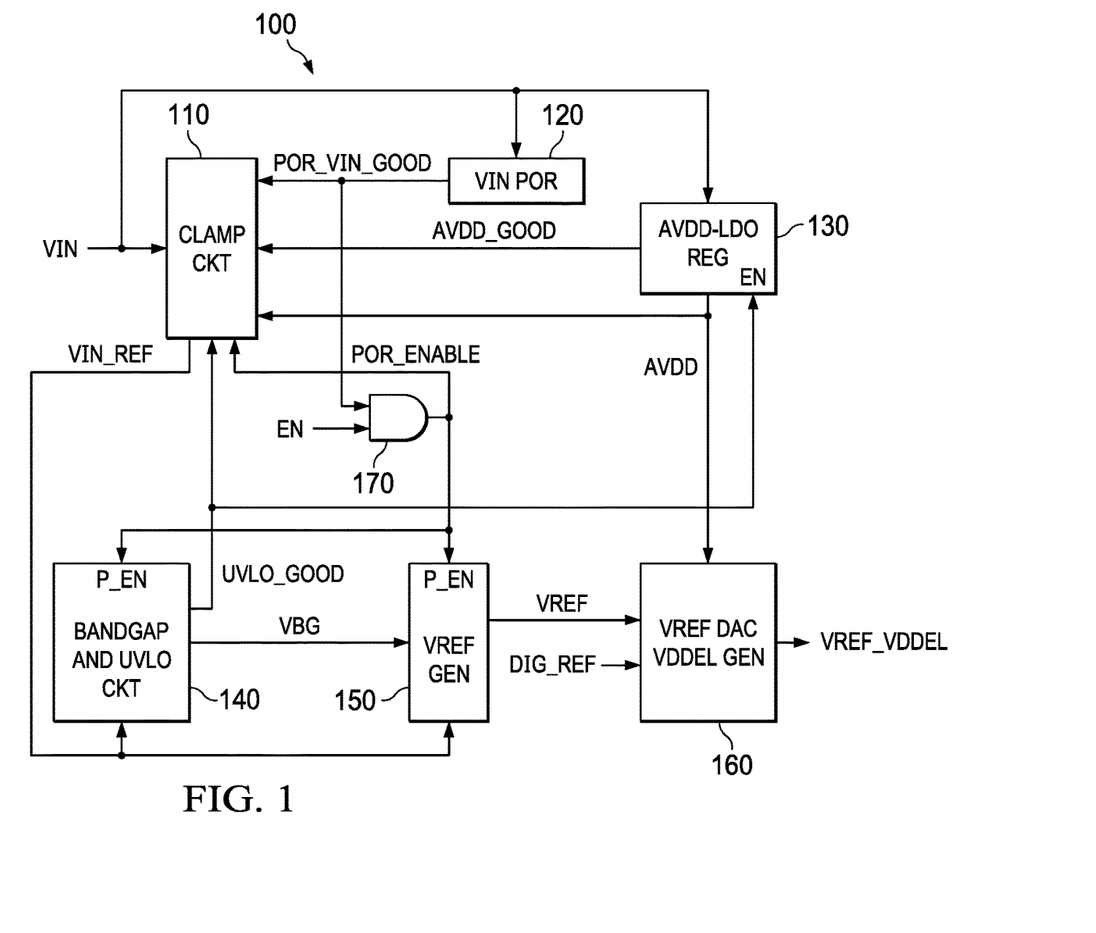
FIG. 1 is a block diagram of at least a portion of a power supply that includes a clamp circuit to increase the PSRR of the power supply.

FIG. 1 shows an example of at least a portion of a power supply 100. The power supply 100 receives an input voltage (VIN) and generates an output voltage (VREF_VDDEL). In one example VIN is in the range of 2.5 V to 5.0 V and VREF_VDDEL is a voltage in the range of 0.473 V to 1.0 V (e.g., 0.77V). VREF_VDDEL may be supplied to a boost converter to increase the voltage to, for example, 8.47 V. The power supply 100 may provide power to drive a load, such as an active matrix organic light emitting diode (AMOLED).

In this example, the power supply 100 includes a clamp circuit 110, an input voltage power-on reset circuit (VIN POR) 120, an AVDD_low dropout (LDO) regulator 130, a bandgap and undervoltage lockout (UVLO) circuit 140, a reference voltage (VREF) generator 150, a VREF digital-to-analog converter (DAC) VDDEL generator 160, and an AND gate 170. The AVDD_LDO regulator 130 generates a regulated output voltage AVDD, which is provided to the VREF DAC VDDEL generator 160 to power a DAC within the VREF DAC VDDEL generator 160. A digital reference value (DIG REF) is provided to the VREF DAC VDDEL generator 160 to be converted to a corresponding analog output voltage, VREF_VDDEL. The DAC within the VREF DAC VDDEL generator 160 uses a reference voltage (VREF) generated by the VREF generator 150 for the digital-to-analog conversion process. The VREF generator uses a bandgap voltage (VBG) generated by the bandgap and UVLO circuit 140 to generate VREF. The bandgap and UVLO circuit 140 generates the overall system reference voltage for all DACs and includes an undervoltage detection of VIN capability.

The VIN POR 120 and the bandgap and UVLO circuit 140 generate respective POR_VIN_GOOD and UVLO_GOOD signals to indicate whether VIN is greater than corresponding thresholds. For example, the VIN POR 120 asserts (e.g., logic high) POR_VIN_GOOD when VIN is greater than a first threshold, and the bandgap and UVLO circuit 140 asserts UVLO_GOOD when VIN is greater than a second threshold. In one example, the first threshold is 1.9 V, and the second threshold is 2.45 V. Upon a power-on event, VIN ramps upward from 0 V to its steady state level. When VIN reaches the first threshold (e.g., 1.9 V), VIN POR 120 asserts POR_VIN_GOOD, and when VIN then reaches the second threshold (e.g., 2.45 V), the bandgap and UVLO circuit 140 asserts UVLO_GOOD. Any circuit within the power supply 100 that should only be operative when VIN is above the first threshold will receive the POR_VIN_GOOD signal to trigger that particular circuit to operate when VIN reaches the first threshold. Similarly, any circuit within the power supply 100 (e.g., AVDD_LDO regulator 130) that should only be operative when VIN is above the second threshold will receive the UVLO_GOOD signal to trigger that particular circuit to operate when VIN reaches the second threshold. Further, the clamp circuit 110 receives both the POR_VIN_GOOD signal and the UVLO_GOOD signal.

The AVDD_LDO regulator 130 asserts (e.g., logic high) an AVDD_GOOD signal when the AVDD voltage from the AVDD_LDO regulator 130 is above a particular threshold. In one example, AVDD_GOOD is asserted when AVDD (which has a desired value of, for example, 1.8V) is above 1.7 V. AVDD_GOOD signal also is provided to the clamp circuit 110.

AND gate 170 has inputs that receive an enable (EN) signal and POR_VIN_GOOD. The output signal from AND gate 170 is designated POR_ENABLE. POR_ENABLE is asserted high when both POR_VIN_GOOD and EN are high, that is when VIN is above the first threshold (e.g., 1.9 V) and the enable signal to the power supply 100 is asserted high. The POR_ENABLE signal is provided to P_EN inputs of the bandgap and UVLO circuit 140 and the VREF generator 150. Those circuits (bandgap and UVLO circuit 140, VREF generator 150) are enabled when POR_EN- ABLE is asserted high. Although an AND gate is shown in this example, other types or combinations of logic gates can be used in other examples.

The output voltage VREF_VDDEL from the power supply 100 is susceptible to transients in VREF from the VREF generator 150. That is, a transient in VREF will cause a transient in VREF_VDDEL. Absent the clamp circuit 110 (described below), VIN would be supplied directly to the bandgap and UVLO circuit 140 and to the VREF generator 150. As such, transients on VIN would cause substantial transients on VREF. However, it may be desired that the supply voltage to a load powered by the power supply 100 should experience a transient below a particular level for a given transient on VIN. The clamp circuit 100 receives VIN and generates a voltage VIN_REF for the bandgap and UVLO circuit 140 and the VREF generator 150. The clamp circuit 110 beneficially reduces any transients on VREF due to transients on VIN.

The clamp circuit 110 is coupled to the VIN POR 120, the AVDD_LDO regulator 130, the bandgap and UVLO circuit 140, the VREF generator 150, and the AND gate 170. The clamp circuit 110 receives the POR_VIN_GOOD signal, the AVDD_GOOD signal, the UVLO_GOOD signal, VIN, and AVDD, and generates voltage VIN_REF. During steady state operation, the clamp circuit 110 generates VIN_REF based on AVDD. AVDD is generated by the AVDD_LDO regulator 130, which itself has a relatively high PSRR. Because the AVDD_LDO regulator 130 has a high PSRR, and the clamp circuit 110 uses AVDD from the AVDD_LDO regulator 130 to generate VIN_REF for the bandgap and UVLO circuit 140 and the VREF generator 150, then VREF and VREF_VDDEL are generated with circuitry that has a relatively high PSRR.

Figure 2:
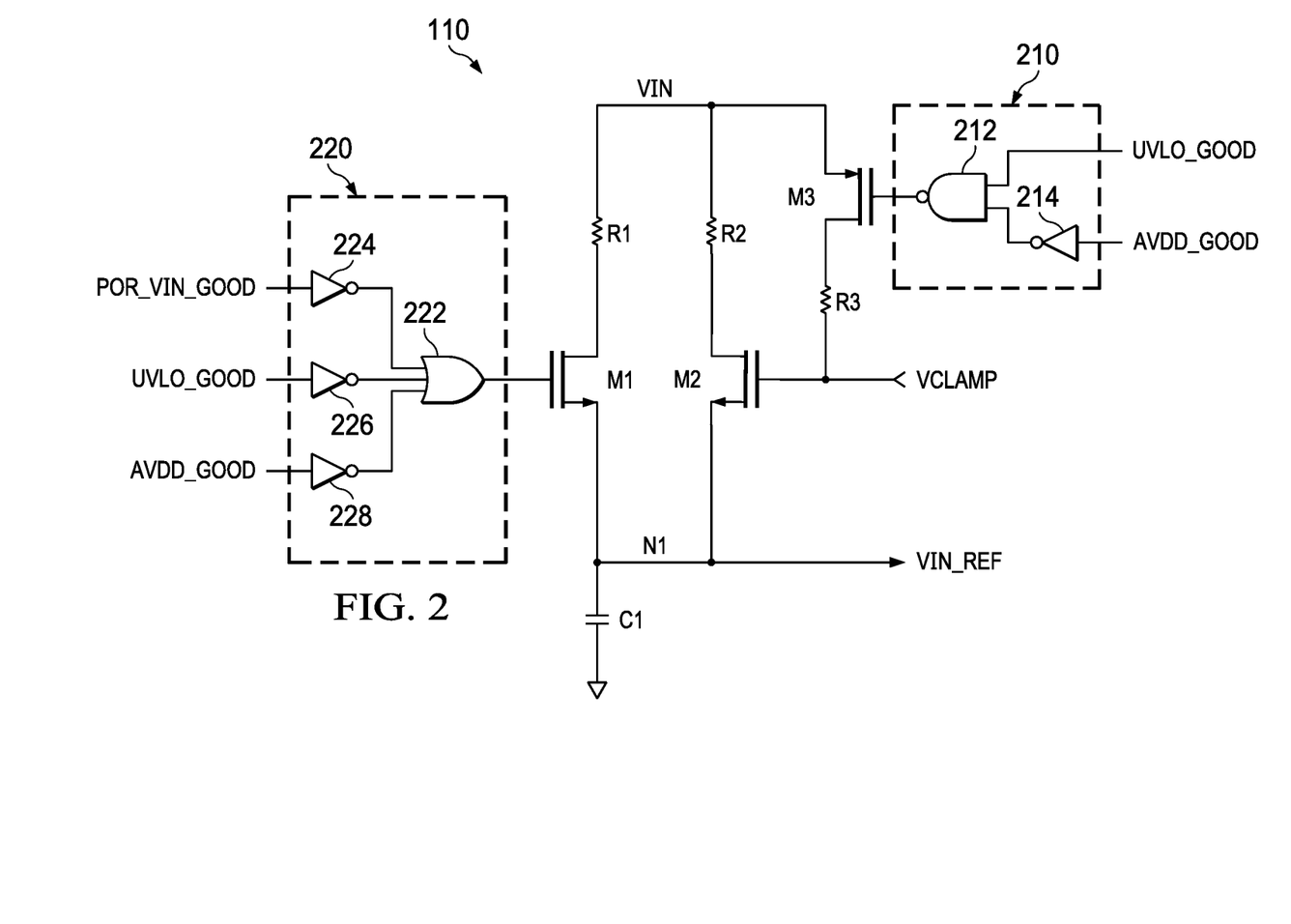
FIG. 2 shows a portion of an example implementation of the clamp circuit of FIG. 1.
Figure 3:
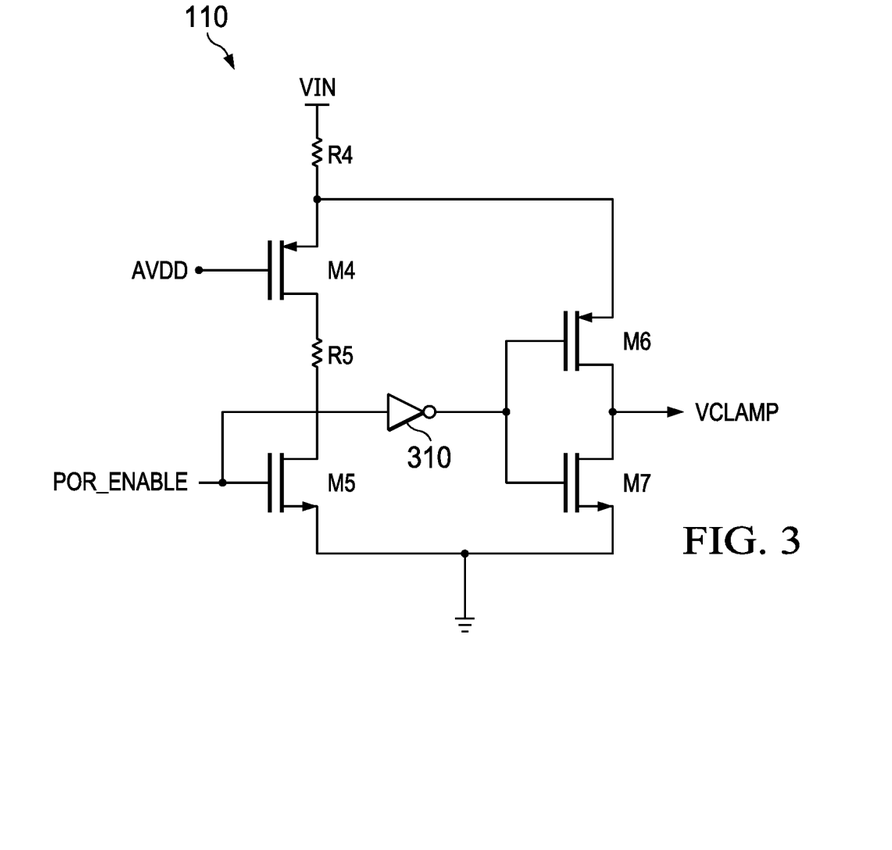
FIG. 3 shows another portion of an example implementation of the clamp circuit of FIG. 1.

FIGS. 2 and 3 show an example implementation of the clamp circuit 110. One portion of the clamp circuit 110 is shown in FIG. 2 and another portion of the clamp circuit 110 is shown in FIG. 3. In the example of FIG. 2, the portion of the clamp circuit 110 shown includes digital circuits 210 and 220, resistors R1-R3, capacitor C1, and transistors M1-M3. Digital circuit 210 includes a NAND gate 212 and an inverter 214. One input of the NAND gate 212 is coupled to the output of the inverter 214. The inverter 214 receives the AVDD_GOOD signal, and the corresponding input of the NAND gate 212 receives the logical inverse of AVDD_GOOD. The other NAND gate 212 input receives the UVLO_GOOD signal. Transistor M3 in this example is a p-type metal oxide semiconductor field effect (PMOS) transistor, the gate of which is coupled to the output of NAND gate 212.

The source of transistor M3 is coupled to VIN, and the drain of transistor M3 is coupled to resistor R3. The opposite terminal of resistor R3 is connected to the gate of transistor M2. Transistors M1 and M2 in this example comprise n-type metal oxide semiconductor field effect (NMOS) transistors. The sources of transistors M1 and M2 are connected together at node N1 and to capacitor C1. Capacitor C1 is connected between the sources of transistors M1 and M2 (node N1) and ground. The voltage on node N1 is VIN REF. Resistor R2 is connected between the drain of transistor M2 and VIN. Similarly, resistor R1 is connected between the drain of transistor M1 and VIN.

Digital circuit 220 in this example includes an OR gate 222 and inverters 224, 226, and 228. The outputs of the inverters 224-228 are connected to corresponding inputs of the OR gate 222. The input of inverter 224 receives POR_VIN_GOOD. The input of inverter 226 receives UVLO_GOOD. The input of inverter 228 receives AVDD_GOOD.

The gate of transistor M2 also receives a voltage VCLAMP. During steady state operation, in which VIN has reached its steady state level, VCLAMP is generated by the portion of the clamp circuit 110 shown in FIG. 3. That portion (FIG. 3) of the clamp circuit includes PMOS transistors M4 and M6, NMOS transistors M5 and M7, inverter 310, and resistors R4 and R5. Resistor R4 is connected between VIN and the source of transistor M4. Resistor R5 is connected between the drains of transistors M4 and M5.

The source of transistor M4 also is connected to the source of transistor M6. The drains of transistors M6 and M7 are connected together and provide the voltage VCLAMP. The gates of transistors M6 and M7 are connected together. POR_ENABLE is provided to the gate of transistor M5 and to the input of inverter 310. The output of inverter 310 is connected to the gates of transistors M6 and M7. AVDD is provided to the gate of transistor M4.

During a power-on cycle, VIN increases from 0 V to its steady state voltage level, which is application-specific. In one example, the steady state voltage level of VIN is 3.5 V. Upon VIN exceeding the threshold voltage (e.g., 1.9 V) associated with VIN POR 120, POR_VIN_GOOD is asserted high by VIN POR 120. Similarly, upon VIN reaching the threshold voltage (e.g., 2.45 V) associated with the bandgap and UVLO circuit 140, the bandgap UVLO circuit 140 asserts UVLO_GOOD high. Upon VIN reaching a voltage sufficiently high to permit the AVDD_LDO regulator 130 to generate the voltage AVDD, the AVDD_LDO regulator 130 asserts AVDD_GOOD high. POR_VIN_GOOD, UVLO_GOOD, and AVDD_GOOD are provided to the respective inputs of inverters 224, 226, and 228. The output of OR gate 222 will be high as long as at least one of the POR_VIN_GOOD, UVLO_GOOD, and AVDD_GOOD signals are low.

At least one of the POR_VIN_GOOD, UVLO_GOOD, and AVDD_GOOD signals being low indicates that the power supply 100 is still in a power-on cycle and VIN has not yet reached its final steady state level. With at least one of the POR_VIN_GOOD, UVLO_GOOD, and AVDD_GOOD signals being low, the output signal from OR gate 222 will be high and transistor M1 will be on. With transistor M1 on, capacitor C1 will be charged, and node N1 will have a positive voltage VIN_REF approximately equal to VIN.

As VIN continues to increase during the power-on cycle, eventually, UVLO_GOOD is asserted high (e.g., when VIN reaches 2.45 V), but AVDD_GOOD is still logic low (VIN is not high enough for the AVDD_LDO regulator 130 to generate AVDD). During this condition (UVLO_GOOD high and AVDD_GOOD low), the output signal from NAND gate 212 will be low, and PMOS transistor M3 will be turned on. During this portion of the power-on cycle, M3 thus is turned on and VCLAMP is pulled up through resistor R3 and transistor M3 to VIN.

The portion of the clamp circuit 100 in FIG. 3 actively asserts VCLAMP after VIN eventually reaches a level that the AVDD_LDO regulator 130 is able to generate AVDD. Before that condition is reached, however, VCLAMP is pulled up to VIN so that the transition to VCLAMP being actively controlled by the circuit of FIG. 3 is glitch free. With transistor M3 on and VCLAMP pulled up to VIN (via R3 and M3), the voltage on the gate of transistor M2 is VCLAMP. The voltage on the source of transistor M2 (VIN_REF) is approximately equal to VCLAMP minus the threshold voltage of transistor M2, and thus VIN_REF is clamped by transistor M2 to VCLAMP minus a threshold voltage of transistor M2.

When VIN eventually reaches a sufficient level to permit the AVDD_LDO regulator 130 to generate AVDD, all three of the POR_VIN_GOOD, UVLO_GOOD, and AVDD_GOOD signals will be high, the output signal from OR gate 222 will be low, and transistor M1 turns off. Also, with AVDD_GOOD being high, the output of inverter 214 will be low, and the output signal from NAND gate 212 will be high, which turns off transistor M3. As such, the circuit in FIG. 2 no longer actively controls VCLAMP, and the circuit of FIG. 3 actively controls VCLAMP as explained below.

Referring to FIG. 3, POR_ENABLE controls the on and off states of transistors M5-M7. POR ENABLE is low when VIN is less than the threshold associated with VIN POR 120. With POR_ENABLE being low, transistor M5 and M6 will be off, and transistor M7 will be on. With transistor M7 on, VCLAMP is pulled low to ground. When VIN reaches the threshold of VIN POR 120, and assuming EN is high, POR_ENABLE becomes high, at which point transistor M7 turns off and transistors M5 and M6 turn on.

When POR_ENABLE becomes high but UVLO_GOOD is still low, the AVDD_LDO regulator 130 will not be enabled yet, and AVDD will be 0V. After the VIN voltage reaches the UVLO_GOOD threshold, UVLO_GOOD will be asserted high and the AVDD_LDO regulator 130 will be enabled and the AVDD voltage will rise to the target voltage of, for example, 1.8V. Transistor M4 is turned on during this time and conducts a current limited by resistor R5.

When VIN reaches the level at which the AVDD_LDO regulator 130 (which has a relatively high PSRR) generates AVDD, the gate of PMOS transistor M4 receives the AVDD voltage, which is smaller then VIN. Because AVDD is generated from a circuit having a relatively high PSRR, VCLAMP also is generated by a circuit (AVDD_LDO regulator 130 plus the circuitry of FIG. 3) that has a relatively high PSRR.

When all three of POR_VIN GOOD, UVLO_GOOD, and AVDD_GOOD are high, the power supply 100 has reached its steady state level, VCLAMP is actively controlled by the circuit of FIG. 3, and transistors M1 and M3 are off. VCLAMP is generated during the steady state operation of power supply 100 with a relatively high PSRR, which means that VCLAMP is not very susceptible to glitches in VIN. Transistor M2 functions as a source-follower transistor in which its source voltage is one threshold voltage below its gate voltage. Thus, the source voltage of transistor M2 (i.e., VIN_REF) during the power supply's steady state operation is approximately one threshold voltage below VCLAMP, and VCLAMP is generated with a relatively high PSRR circuit.

The clamp circuit 110 is operative to generate VIN_REF for the bandgap and UVLO circuit 140 and the VREF generator 150 in a way that is much less sensitive to glitches in VIN than if VIN was used to directly power the bandgap and UVLO circuit 140 and the VREF generator 150. As such, VREF provided to the VREF DAC VDDEL generator 160 has relatively little sensitivity to glitches in VIN, and the same is true for VREF_VDDEL output from the VREF DAC VDDEL generator 160.

Figure 4:
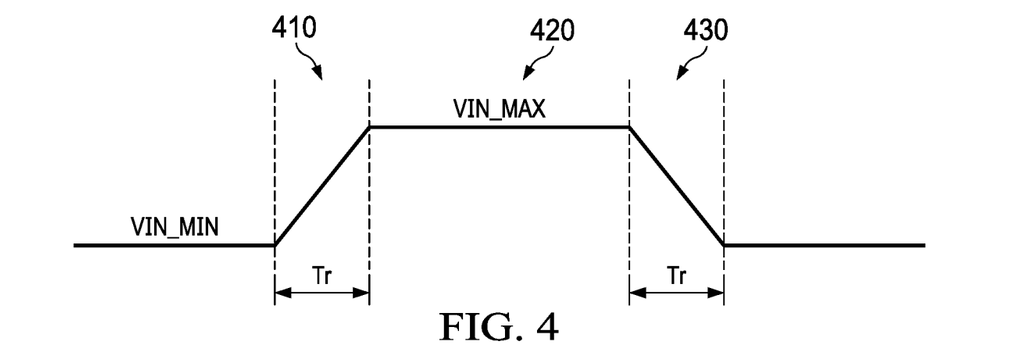
FIG. 4 shows an example of a waveform for the input voltage to the power supply to assess satisfactoriness of the power supply's PSRR.

FIG. 4 shows an example of a waveform for VIN that can be used to assess how well Vref and VREF_VDDEL are immune to glitches in VIN. The test waveform of FIG. 4 includes a defined glitch for VIN with VIN starting at VIN_MIN and increasing during a ramp-up period 410 to a level of VIN_MAX. VIN remains at VIN_MAX for a time period 420, and then decreases during a ramp-down period 430 to VIN_MIN again. The time duration of the ramp-up period 410 and the ramp-down period 430 is the same, Tr. In one example, VIN_MIN is 3 V, VIN_MAX is 3.5 V, and Tr is 10 microseconds. The slew rate of VIN during the ramp-up and ramp-down periods in this example is 50 kV/s.

Figure 5:
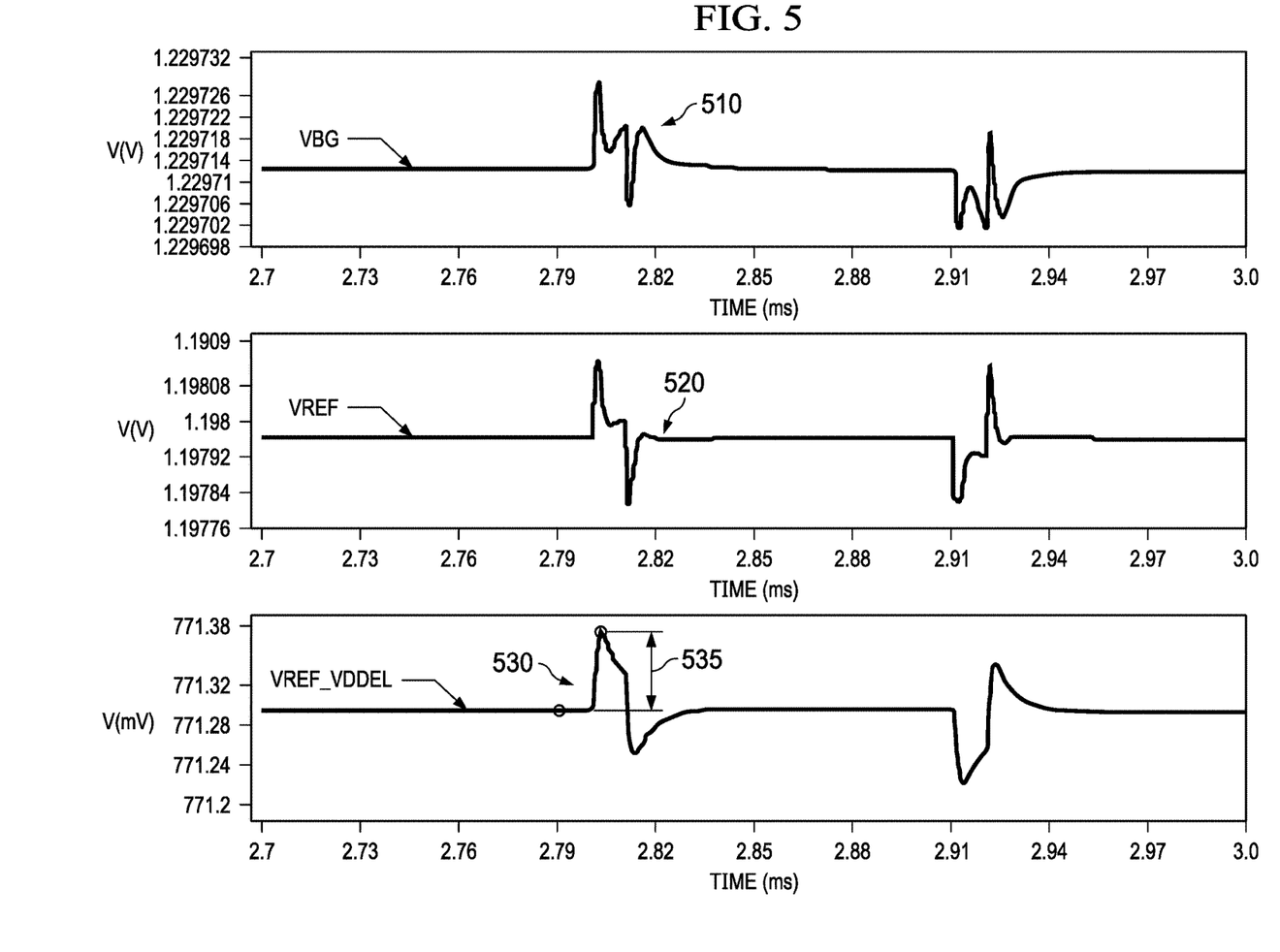
FIG. 5 shows example waveforms of voltages within the power supply using the input waveform example of FIG. 4.

FIG. 5 shows waveforms for VBG, VREF, and VREF_VDDEL with the VIN test waveform of FIG. 4 applied to the clamp circuit 110. The glitch defined by the test waveform of FIG. 4 causes glitches 510, 520, and 530 in VBG, VREF, and VREF_VDDEL, respectively. The magnitude 535 of the glitch in VREF_VDDEL in this example is about 76 microvolts. As such, a 0.5 V glitch in VIN with a 50 kV/s slew rate results in only a 76 microvolt deviation in VREF_VDDEL. The 76 microvolt VREF_VDDEL deviation is much smaller than would have been the case had VIN been used to directly power the bandgap and UVLO circuit 140 and the VREF generator 150 and without the use of the clamp circuit 110.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims

What is claimed is:

1. A circuit, comprising:
   a digital-to-analog converter (DAC) having a DAC input and a DAC output;
   a reference voltage (VREF) generator having a VREF generator input, a VREF generator output, and a VREF power supply input, the VREF generator output coupled to the DAC input;
   a voltage regulator having a voltage regulator input and a voltage regulator output, the voltage regulator output coupled to the DAC; and
   a clamp circuit having a first clamp circuit input, a second clamp circuit input, and a clamp circuit output, the first clamp circuit input coupled to the voltage regulator input, the clamp circuit output coupled to the VREF power supply input, and the second clamp circuit input coupled to the voltage regulator output, the clamp circuit including a source-follower circuit having the second clamp circuit input.

2. The circuit of claim 1, wherein the source-follower circuit comprises a first transistor having a first control input comprising the second clamp circuit input, the first transistor also comprising a first current terminal and a second current terminal, wherein the clamp circuit includes:
   a second transistor having a second control input, a third current terminal, and a fourth current terminal, the third current terminal coupled to the first current terminal; and
   a resistor coupled between the first current terminal and the first clamp circuit input.

3. The circuit of claim 2, wherein the first transistor comprises a p-type metal oxide semiconductor field effect transistor.

4. The circuit of claim 2, wherein the clamp circuit comprises a third transistor having a third control input, a fifth current terminal, and a sixth current terminal, the third control input coupled to the fourth current terminal.

5. The circuit of claim 4, further comprising a capacitor coupled between the sixth current terminal a supply voltage node.

6. The circuit of claim 1, wherein the clamp circuit comprises:
a first resistor;
a first transistor coupled in series with the first resistor between the first clamp circuit input and the clamp circuit output, the first transistor having a first control input;
a second resistor;
a second transistor coupled in series with the second resistor between the first clamp circuit input and the clamp circuit output, the second transistor having a second control input; and
a third resistor; and
a third transistor coupled in series with the third resistor between the first clamp circuit input and the second control input.

7. The circuit of claim 6, further comprising a digital logic circuit comprising a first logic circuit input, a second logic circuit input, and a logic circuit output, the first logic circuit input configured to receive a first logic signal indicative of a level of an input voltage on the first clamp circuit relative to a first threshold, the second logic circuit input configured to receive a second logic signal indicative of the level of the input voltage relative to a second threshold, and the logic circuit output coupled to the first control input.

8. The circuit of claim 6, wherein the third transistor includes a third control input, and the circuit further comprises a digital logic circuit including a first logic circuit input, a second logic circuit input, and a logic circuit output, the first logic circuit input configured to receive a first logic signal indicative of a level of an input voltage on the first clamp circuit relative to a first threshold, the second logic circuit input configured to receive a second logic signal indicative of the level of the input voltage relative to a second threshold, and the logic circuit output coupled to the third control input.

9. A circuit, comprising:
a reference voltage (VREF) generator having a VREF generator input, a VREF generator output, and a VREF power supply input, the VREF generator output is configured to provide a reference voltage;
a voltage regulator having a voltage regulator input and a voltage regulator output, the voltage regulator output configured to provide a supply voltage; and
a clamp circuit having a first clamp circuit input, a second clamp circuit input, and a clamp circuit output, the first clamp circuit input coupled to the voltage regulator input, the clamp circuit output coupled to the VREF power supply input, and the second clamp circuit input coupled to the voltage regulator output to receive the supply voltage, the clamp circuit including a transistor having a first control input and first and second current terminals, the second current terminal comprising the clamp circuit output, and the clamp circuit configured to generate a clamp voltage for the first control input.

10. The circuit of claim 9, wherein the clamp circuit comprises a first resistor coupled between the first clamp circuit input and the first current terminal.

11. The circuit of claim 9, further comprising:
a first current branch coupled between the first clamp circuit input and the clamp circuit output, the first current branch configured to conduct current during a power-on cycle of the circuit until an input voltage on the first clamp circuit input is greater than a first threshold; and
a second current branch coupled between the first clamp circuit input and the first control input, the second current branch configured to conduct current during the power-on cycle responsive to the input voltage being between a second threshold and the first threshold, the first threshold being greater than the second threshold, and the second threshold is greater than a ground potential.

12. The circuit of claim 11, further comprising a digital logic circuit comprising a first logic circuit input, a second logic circuit input, and a logic circuit output, the first logic circuit input configured to receive a first logic signal indicative of a level of an input voltage on the first clamp circuit relative to the first threshold, the second logic circuit input configured to receive a second logic signal indicative of the level of the input voltage relative to the second threshold, and the logic circuit output configured to turn on and off the first current branch.

13. The circuit of claim 9, wherein the clamp circuit comprises a source-follower circuit having a source-follower input and a source-follower output, the source-follower input coupled to the voltage regulator output.

14. The circuit of claim 13, wherein the transistor is a first transistor, and the clamp circuit comprises a second transistor coupled to the source-follower output, the second transistor comprising the clamp circuit output.

15. The circuit of claim 9, further comprising a digital-to-analog converter (DAC) coupled to the VREF output.

16. A circuit, comprising:
a digital-to-analog converter (DAC) having a DAC input and a DAC output;
a reference voltage (VREF) generator having a VREF generator input, a VREF generator output, and a VREF power supply input, the VREF generator output coupled to the DAC input;
a voltage regulator having a voltage regulator input and a voltage regulator output, the voltage regulator output configured to provide a supply voltage; and
a clamp circuit having a first clamp circuit input, a second clamp circuit input, and a clamp circuit output, the first clamp circuit input coupled to the voltage regulator input, the clamp circuit output coupled to the VREF power supply input, and the second clamp circuit input coupled to the voltage regulator output to receive the supply voltage, the clamp circuit including a transistor having a first control input and first and second current terminals, the second current terminal comprising the clamp circuit output, and the clamp circuit configured to generate a clamp voltage for the first control input.

17. The circuit of claim 16, further comprising:
a first current branch coupled between the first clamp circuit input and the clamp circuit output, the first current branch configured to conduct current during a power-on cycle of the circuit until an input voltage on the first clamp circuit input is greater than a first threshold; and
a second current branch coupled between the first clamp circuit input and the first control input, the second current branch configured to conduct current during the power-on cycle responsive to the input voltage being between a second threshold and the first threshold, the first threshold being greater than the second threshold, and the second threshold is greater than a ground potential.

18. The circuit of claim 17, further comprising a digital logic circuit comprising a first logic circuit input, a second logic circuit input, and a logic circuit output, the first logic circuit input configured to receive a first logic signal indicative of a level of an input voltage on the first clamp circuit relative to the first threshold, the second logic circuit input configured to receive a second logic signal indicative of the level of the input voltage relative to the second threshold, and the logic circuit output configured to turn on and off the first current branch.

19. The circuit of claim 16, wherein the clamp circuit comprises a source-follower circuit having a source-follower input and a source-follower output, the source-follower input coupled to the voltage regulator output.

20. The circuit of claim 19, wherein the transistor is a first transistor, and the clamp circuit comprises a second transistor coupled to the source-follower output, the second transistor comprising the clamp circuit output.

\* \* \* \* \*